US008487643B2

(12) United States Patent
Chen et al.

(10) Patent No.: US 8,487,643 B2
(45) Date of Patent: Jul. 16, 2013

(54) SUBSTRATE WITH TEST CIRCUIT

(75) Inventors: Yupeng Chen, Beijing (CN); Hua Liu, Beijing (CN); Haoran Gao, Beijing (CN); Yu Lu, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 341 days.

(21) Appl. No.: 12/718,451

(22) Filed: Mar. 5, 2010

(65) Prior Publication Data

US 2010/0224875 A1 Sep. 9, 2010

(30) Foreign Application Priority Data

Mar. 6, 2009 (CN) .......................... 2009 1 0079296

(51) Int. Cl.
*G01R 31/304* (2006.01)

(52) U.S. Cl.
USPC ............. 324/760.01; 324/762.01; 324/763.01

(58) Field of Classification Search
USPC ........................................ 324/760.01–763.01
See application file for complete search history.

(56) References Cited

U.S. PATENT DOCUMENTS

| | | | | |
|---|---|---|---|---|
| 6,573,960 | B2 * | 6/2003 | Kobayashi et al. | 349/113 |
| 6,677,171 | B1 * | 1/2004 | Nagata et al. | 438/17 |
| 7,123,044 | B2 * | 10/2006 | Orii et al. | 324/760.02 |
| 7,365,562 | B2 * | 4/2008 | Jeon | 324/760.01 |
| 7,456,647 | B2 * | 11/2008 | Jeon et al. | 324/760.01 |
| 7,733,115 | B2 * | 6/2010 | Chen et al. | 324/760.02 |
| 7,859,285 | B2 * | 12/2010 | Sheu et al. | 324/760.01 |
| 8,149,010 | B2 * | 4/2012 | Kang et al. | 324/760.01 |
| 8,310,267 | B2 * | 11/2012 | Sekiguchi et al. | 324/762.01 |
| 2005/0286005 | A1 * | 12/2005 | Watanabe et al. | 349/149 |
| 2008/0129327 | A1 * | 6/2008 | Kim | 324/770 |

FOREIGN PATENT DOCUMENTS

| | | | |
|---|---|---|---|
| CN | 1713032 | A | 12/2005 |
| CN | 101359105 | A | 2/2009 |

* cited by examiner

*Primary Examiner* — Joshua Benitez-Rosario
(74) *Attorney, Agent, or Firm* — Ladas & Parry LLP

(57) ABSTRACT

The present invention relates to a substrate with a substrate test circuit. In an embodiment, by making the length of the wiring from a first data-line-test input terminal to a first panel equal to that of the wiring from a second data-line-test input terminal to the first panel, the input resistances between two test input terminals of a first data-line-test line and the first panel are identical, and thus when a data line of the first panel is detected, the voltage drops of test signals inputted from the two test input terminals are the same, and the test signals actually loaded to the first panel are the same and the detecting abilities are identical.

12 Claims, 4 Drawing Sheets

SUBSTRATE WITH TEST CIRCUIT

BACKGROUND

The present invention relates to a substrate with a test circuit for a thin film transistor liquid crystal display (TFT-LCD).

As the technology for manufacturing a thin film transistor liquid crystal display (TFT-LCD) is gradually perfected and the cost thereof is gradually reduced, the TFT-LCD has been used widely.

A current method for manufacturing a TFT-LCD may comprise the steps: forming some individual TFT pixel array regions on one large substrate with each of the TFT pixel array regions corresponding to an individual panel. In order to perform the signal detection on the TFT pixel array regions formed on the substrate, test circuits for inputting test signals are formed on the substrate together with the TFT pixel array regions. The test circuits are formed around each of the TFT pixel array regions on the substrate. Then, occurrence of electric defects in each of the TFT pixel array regions may be detected by inputting the test signals via test inputs terminal of the test circuits. After the test, liquid crystal is applied on the substrate on which the TFT pixel array regions have been formed. A color filter substrate is put above and assembled to the substrate having the TFT pixel array regions and a large LCD panel is formed. Finally, the large LCD panel is cutting and at the same time the test circuits around each of the pixel array regions are also removed by cutting, and thus individual panels are obtained. FIG. 1 is a schematic view illustrating the structure of the large substrate with test circuits, and as shown in FIG. 1, during the process of forming the TFT pixel array regions and test circuits in the peripheral regions, exposure processes are performed based on two individual panels as an exposure unit. In FIG. 1, twelve individual panels, that is, 1st panel to 12th panel, are arranged on the substrate in an array, and thus, the exposure processes are performed six times because there are six exposure units, and each of the six exposure units is showed as a region surrounded by the dashed lines in FIG. 1. Because a same mask is used for each of the exposure units, the resultant pattern structures are identical among the exposures. Furthermore, the corresponding test circuits are also formed based on the exposure units. The test signal lines for each of the individual panels comprise a data-line-test line, a gate-line-test line and a common-electrode-line-test line, and each of the test signal lines has two test input terminal positioned respectively at an outer edge and a central region of the substrate.

FIG. 2 is a schematic view illustrating a structure for detecting an electric defect occurring in the substrate shown in FIG. 1. As shown in FIG. 2, when a test signal is loaded to the central region, a beam 51 having probes 52 is provided to a device probe frame 5, which is used to positioned the probes 52 such that the test signal can be loaded to the individual panels. The probes 52 contact corresponding test input terminals. Because a distance between a sensor for detecting the electric defect and the panel is only about 15 μm, when the test is performed, it is necessary to raise the sensor one time to go around the beam 51 when passing the beam 51. Thus, this increases the time used for the test and disadvantageously influence the test efficiency. Therefore, when the test on the electric defect is performed, the test input terminal at the central area is not used and only the test input terminal at the outer edge of the substrate is used.

Because only the test input terminals positioned at the outer edge of the substrate are used and the input resistances between the test input terminals at the outer edge of the substrate and the test signal lines corresponding to each of the individual panels are different, the voltage drops are different during the test signal transmission, and thus, the test signals actually loaded to the individual panels are different and the ability of the test circuits to detect the electric defect of each of the individual panels are different.

SUMMARY

An embodiment of the present invention provides a substrate comprising at least one exposure unit disposed at a transverse direction and a substrate test circuit. The substrate test circuit comprises a first data-line-test line, a first gate-line-test line and a first common-electrode-line-test line, which are connected with a first panel within a single exposure unit. The first data-line-test line comprises a first data-line-test input terminal and a second data-line-test input terminal, which are disposed on both sides of the exposure unit, the first gate-line-test line comprises a first gate-line-test input terminal and a second gate-line-test input terminal, which are disposed on both sides of the exposure unit, the first common-electrode-line-test line comprises a first common-electrode-line-test input terminal and a second common-electrode-line-test input terminal, which are disposed on both sides of the exposure unit, the first data-line-test input terminal, the first gate-line-test input terminal and the first common-electrode-line-test input terminal are disposed on the same side of the exposure unit, a length of a wiring from the first data-line-test input terminal to the first panel is the same as a length of a wiring from the second data-line-test input terminal to the first panel; a length of a wiring from the first gate-line-test input terminal to the first panel is the same as a length of a wiring from the second gate-line-test input terminal to the first panel; and a length of a wiring from the first common-electrode-line-test input terminal to the first panel is the same as a length of a wiring from the second common-electrode-line-test input terminal to the first panel.

Another embodiment of the present invention provides a substrate comprising at least one exposure unit disposed at a transverse direction and a substrate test circuit. The substrate test circuit comprises a first data-line-test line connected with a first panel within a single exposure unit, and a second data-line-test line connected with a second panel within the exposure unit. The first data-line-test line comprises a first data-line-test input terminal and a second data-line-test input terminal, which are disposed on both sides of the exposure unit, the second data-line-test line comprises a third data-line-test input terminal and a fourth data-line-test input terminal, which are disposed on both sides of the exposure unit, the first data-line-test input terminal and the third data-line-test input terminal are disposed on the same side of the exposure unit, and a length of a wiring from the first data-line-test input terminal to the first panel is the same as a length of a wiring from the second data-line-test input terminal to the first panel; a length of a wiring from the third data-line-test input terminal to the second panel is the same as a length of a wiring from the fourth data-line-test input terminal to the second panel; and the length of the wiring from the first data-line-test input terminal to the first panel is the same as the length of the wiring from the third data-line-test input terminal to the second panel.

Further another embodiment of the present invention provides substrate comprising at least one exposure unit disposed at a transverse direction and a substrate test circuit. The substrate test circuit comprises a first gate-line-test line connected with a first panel within a single exposure unit, and a second gate-line-test line connected with a second panel in the exposure unit. The first gate-line-test line comprises a first gate-line-test input terminal and a second gate-line-test input terminal, which are disposed on both sides of the exposure unit, the second gate-line-test line comprises a third gate-line-test input terminal and a fourth gate-line-test input terminal, which are disposed on both sides of the exposure unit, the first gate-line-test input terminal and the third gate-line-test input terminal are disposed on the same side of the exposure unit, a length of a wiring from the first gate-line-test input terminal to the first panel is the same as a length of a wiring from the second gate-line-test input terminal to the first panel; a length of a wiring from the third gate-line-test input terminal to the second panel is the same as a length of a wiring from the fourth gate-line-test input terminal to the second panel; and the length of the wiring from the first gate-line-test input terminal to the first panel is the same as the length of the wiring from the third gate-line-test input terminal to the second panel.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Hereinafter, an embodiment of the invention will be further explained in detail with reference to the accompanying drawings.

Figure 1:
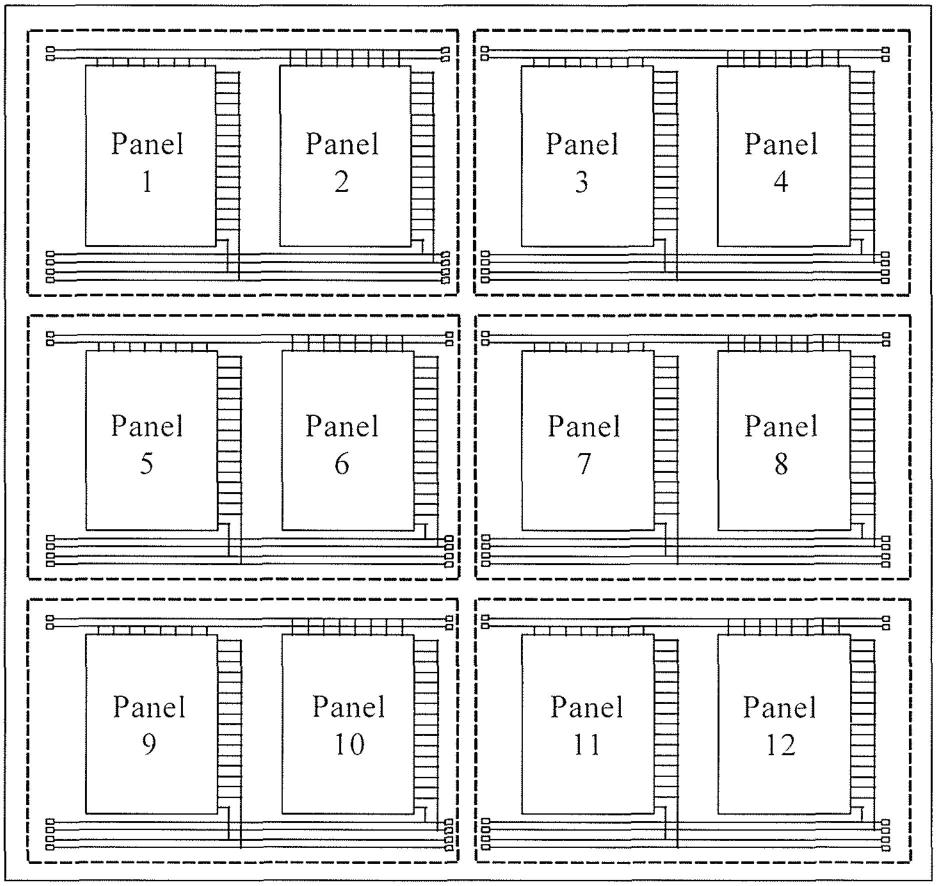
FIG. 1 is a schematic view illustrating a structure of a substrate test circuit.
Figure 2:
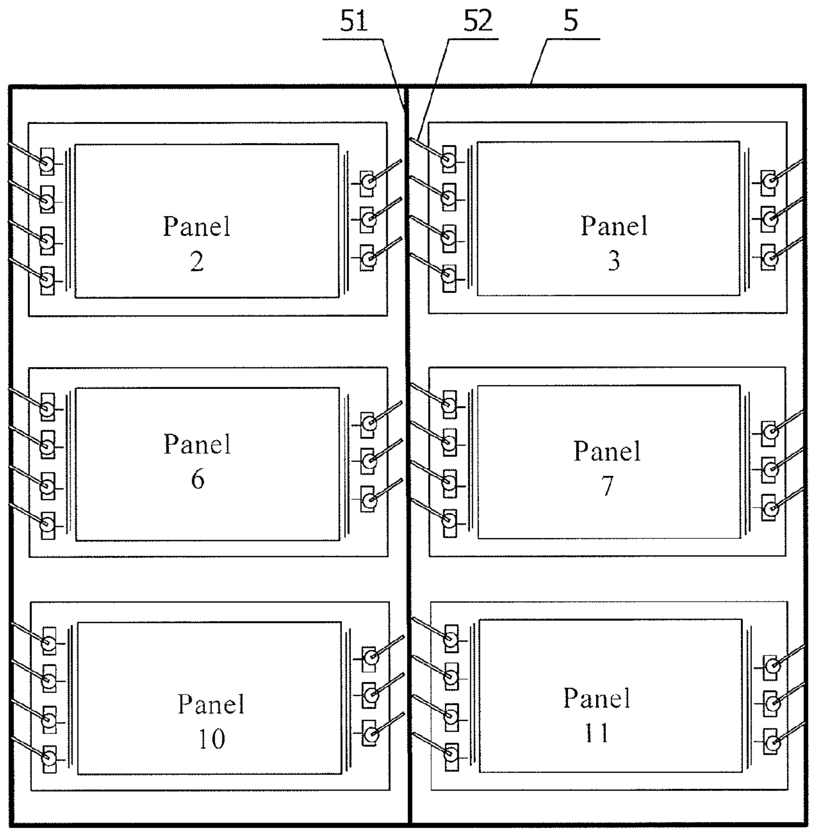
FIG. 2 is a schematic view illustrating a structure for detecting the electric defect of FIG. 1.
Figure 3:
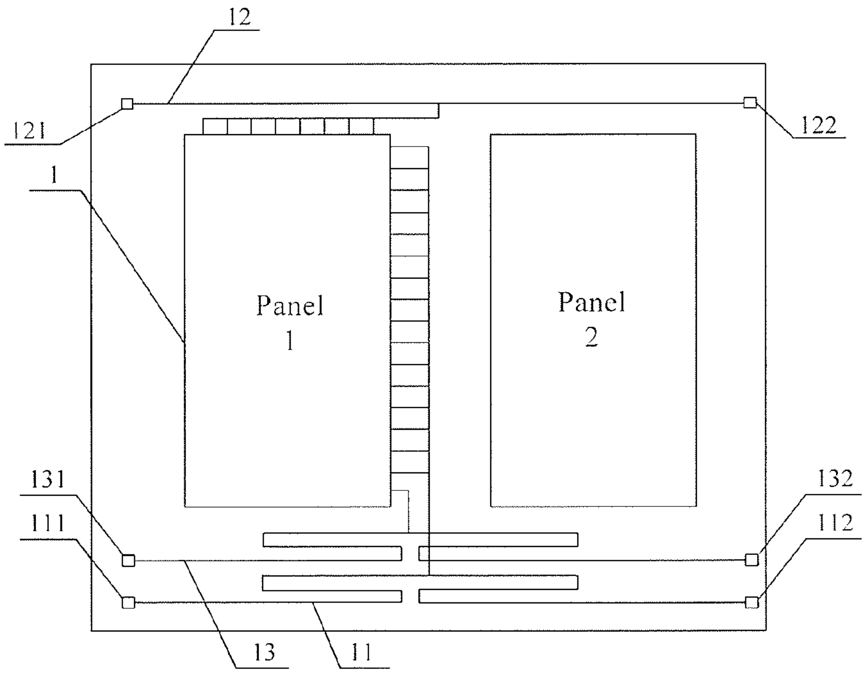
FIG. 3 is a schematic view illustrating a structure of a substrate test circuit according to a first embodiment of the present invention.

FIG. 3 is a schematic view illustrating a structure of a substrate test circuit according to a first embodiment of the present invention. As shown in FIG. 3, the substrate test circuit of the present embodiment comprises a first data-line-test line 11, a first gate-line-test line 12 and a first common-electrode-line-test line 13, which are all connected with a first panel 1 in a single exposure unit on a substrate. The first data-line-test line 11 comprises a first data-line-test input terminal 111 and a second data-line-test input terminal 112, which are disposed on the both sides of the exposure unit, respectively; the first gate-line-test line 12 comprises a first gate-line-test input terminal 121 and a second gate-line-test input terminal 122, which are disposed on the both sides of the exposure unit, respectively; and the first common-electrode-line-test line 13 comprises a first common-electrode-line-test input terminal 131 and a second common-electrode-line-test input terminal 132, which are disposed on the both sides of the exposure unit. The first data-line-test input terminal 111, the first gate-line-test input terminal 121 and the first common-electrode-line-test input terminal 131 are disposed on the same side of the exposure unit. The length of the wiring from the first data-line-test input terminal 111 to the first panel 1 is the same as that of the wiring from the second data-line-test input terminal 112 to the first panel 1. The length of the wiring from the first gate-line-test input terminal 121 to the first panel 1 is the same as that of the wiring from the second gate-line-test input terminal 122 to the first panel 1. The length of the wiring from the first common-electrode-line-test input terminal 131 to the first panel 1 is the same as that of a wiring from the second common-electrode-line-test input terminal 132 to the first panel 1.

More specifically, for example, in one exposure unit arranged on the substrate in a transverse direction, with respect to any one of the test lines connected with the first panel 1, for example, the first data-line-test line 11, the length of the wiring from the first data-line-test input terminal 111 of the first data-line-test line 11 to the first panel 1 is the same as that of the wiring from the second data-line-test input terminal 112 to the first panel 1, and therefore, the input resistance between the first data-line-test input terminal 111 and the first panel 1 is equal to that between the second data-line-test input terminal 112 and the first panel 1, and the signal decay degree is identical on the wirings during the signal transmission. Therefore, when the test signals are inputted from the two test input terminals to detect electric defects, the identical detection ability can be achieved for the first data-line-test line 11 on the first panel 1. Likewise, the identical detection ability can be achieved for both the first gate-line-test line 12 and the first common-electrode-line-test line 13 on the first panel 1, when the test signals are respectively loaded from respective two test input terminals to detect the electric defect.

In the present embodiment, by making the length of the wiring from the first data-line-test input terminal to the first panel equal to that of the wiring from the second data-line-test input terminal to the first panel, the input resistances between two test input terminals of the first data-line-test line and the first panel are identical, and thus when detecting data lines of the first panel, the voltage drops of the test signal inputted from the two test input terminals during transmission are the same, and the test signals actually loaded to the first panel are the same and the detecting abilities are identical when the detection of the electric defect is performed on the data lines of the first panel by using any one of the two test input terminals of the first data-line-test line. Likewise, the identical detecting ability may also be obtained for the detection of the electric defect on the gate lines and the common electrode lines of the first panel.

It should be noted that the above mentioned equivalency, for example, the equivalency between the length of the wiring from the first data-line-test input terminal to the first panel and the length of the wiring from the second data-line-test input terminal to the second panel, is not intended to be absolutely equal, and the slightly difference may exist and the equivalency also comprise the case of being approximate equal.

Figure 4:
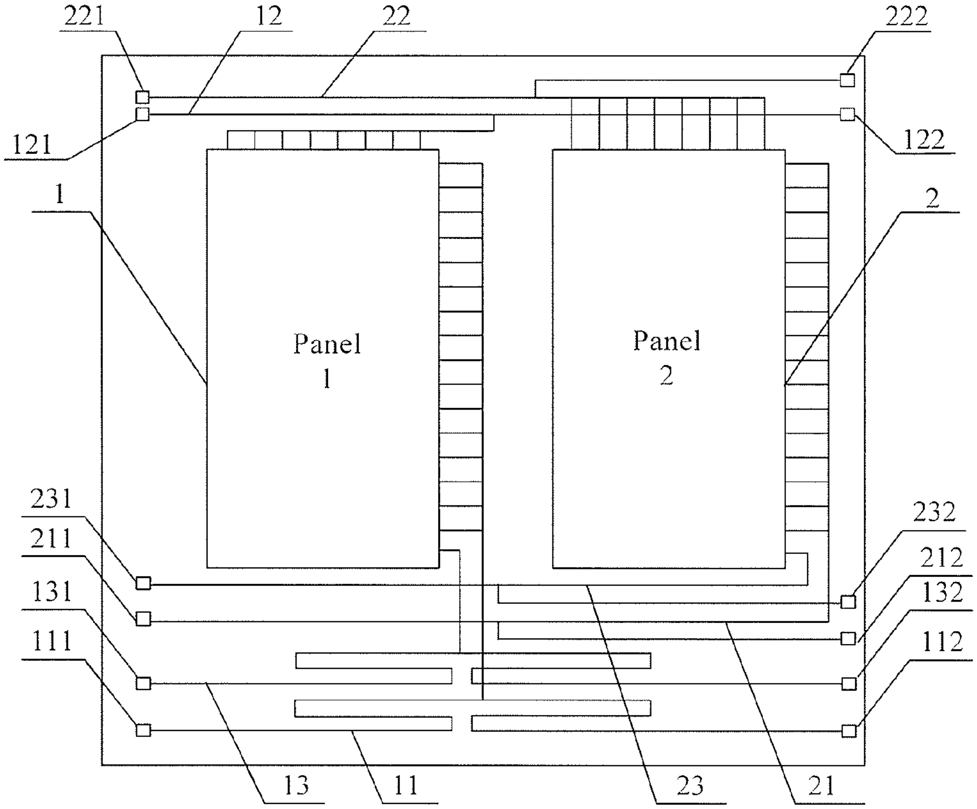
FIG. 4 is a schematic view illustrating a structure of a substrate test circuit according to a second embodiment of the present invention.

FIG. 4 is a schematic view illustrating the structure of a substrate test circuit according to a second embodiment of the present invention. As shown in FIG. 4, besides the components of the substrate test circuit according to the first embodiment, the substrate test circuit of the present embodiment further comprises a second data-line-test line 21, a second gate-line-test line 22 and a second common-electrode-line-test line 23, which are connected with a second panel 2 in the exposure unit. The second data-line-test line 21 comprises a third data-line-test input terminal 211 and a fourth data-line-test input terminal 212, which are disposed on the both sides of the exposure unit; the second gate-line-test line 22 comprises a third gate-line-test input terminal 221 and a fourth gate-line-test input terminal 222, which are disposed on the both sides of the exposure unit; and the second common-electrode-line-test line 23 comprises a third common-electrode-line-test input terminal 231 and a fourth common-electrode-line-test input terminal 232, which are disposed on the both sides of the exposure unit. The third data-line-test input terminal 211, the third gate-line-test input terminal 221 and the third common-electrode-line-test input terminal 231 are disposed on the same side of the exposure unit. The length of the wiring from the third data-line-test input terminal 211 to the second panel 2 is the same as that of the wiring from the fourth data-line-test input terminal 212 to the second panel 2; the length of the wiring from the third gate-line-test input terminal 221 to the second panel 2 is the same as that of the wiring from the fourth gate-line-test input terminal 222 to the second panel 2; and the length of a wiring from the third common-electrode-line-test input terminal 231 to the second panel 2 is the same as that of the wiring from the fourth common-electrode-line-test input terminal 232 to the second panel 2.

In the second panel according to the present embodiment, when the test signals are loaded from respective two test input terminals to detect electric defects, the identical detecting ability can also be obtained for the second data-line-test line 21, the second gate-line-test line 22 and the second common-electrode-line-test line 23.

Based on the substrate test circuit according to the second embodiment, a substrate test circuit according to a third embodiment of the present invention further comprises the following structures: the length of the wiring from the first data-line-test input terminal to the first panel is the same as that of the wiring from the third data-line-test input terminal to the second panel; the length of the wiring from the first gate-line-test input terminal to the first panel is the same as that of the wiring from the third gate-line-test input terminal to the second panel; and the length of the wiring from the first common-electrode-line-test input terminal to the first panel is the same as that of the wiring from the third common-electrode-line-test input terminal to the second panel.

More specifically, with respect to the same kind of test lines of the first panel and the second panel, such as, the first gate-line-test line connected with the first panel and the second gate-line-test line connected with the second panel, the length of the wiring from the first gate-line-test input terminal to the first panel is the same as that of the wiring from the third gate-line-test input terminal positioned at the same side as the first gate-line-test input terminal to the second panel, and thus, the input resistance of the first gate-line-test line connected with the first panel is equal to that of the second gate-line-test line connected with the second panel, and the signal decay degree is identical over the wirings during transmission. Therefore, the identical detecting ability can be obtained for the detection at any position of the substrate by using the first gate-line-test line and the second gate-line-test line. Likewise, the identical detecting ability may also be obtained for the detection at any position of the substrate by using the first data-line-test line and the second data-line-test line or the first common-electrode-line-test line and the second common-electrode-line-test line. Therefore, the same effect to detect the electric defect can be achieved at any position on the substrate.

Based on the substrate test circuit according to the first embodiment of the present invention, the substrate test circuit of the present embodiment further achieves the effect in which the identical detecting ability can also be obtained for the first panel and the second panel at any position of the substrate, and thus, the same effect to detect the electric defect can be achieved at any position on the substrate.

Figure 5:
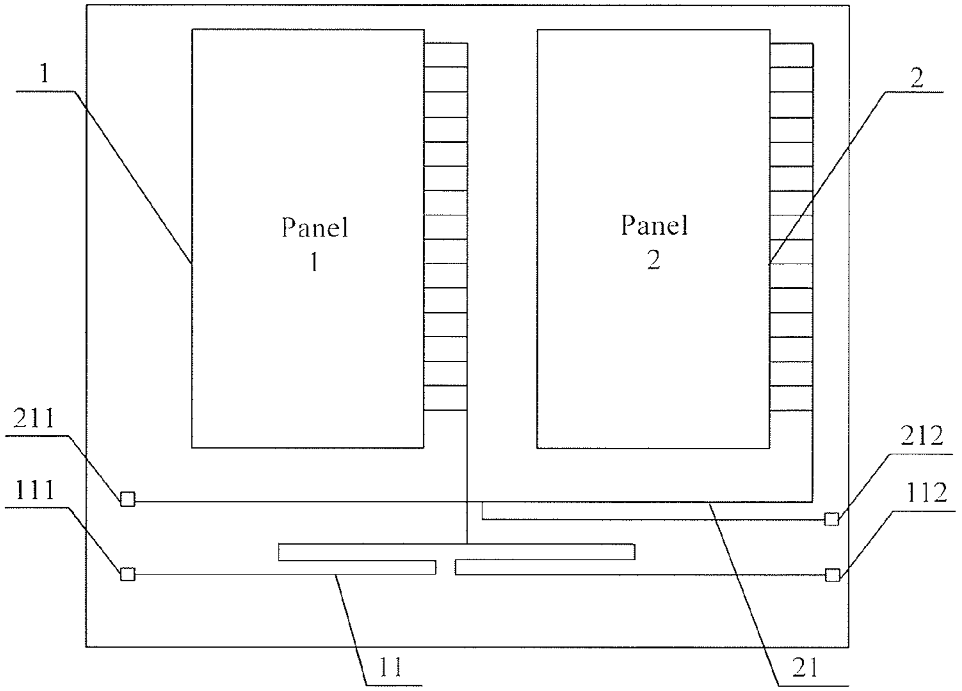
FIG. 5 is a schematic view illustrating a structure of a substrate test circuit according to a fourth embodiment of the present invention.

FIG. 5 is a schematic view illustrating a structure of a substrate test circuit according to the fourth embodiment of the present invention. As shown in FIG. 5, the substrate test circuit of the present embodiment comprises a first data-line-test line 11 connected with a first panel 1 in a single exposure unit and a second data-line-test line 21 connected with a second panel 2 in the exposure unit. The first data-line-test line 11 comprises a first data-line-test input terminal 111 and a second data-line-test input terminal 112, which are disposed on the both sides of the exposure unit; the second data-line-test line 21 comprises a third data-line-test input terminal 211 and a fourth data-line-test input terminal 212, which are disposed on the both sides of the exposure unit. The first data-line-test input terminal 111 and the third data-line-test input terminal 211 are disposed on the same side of the exposure unit. The length of the wiring from the first data-line-test input terminal 111 to the first panel 1 is the same as that of the wiring from the second data-line-test input terminal 112 to the first panel 1; the length of the wiring from the third data-line-test input terminal 211 to the second panel 2 is the same as that of the wiring from the fourth data-line-test input terminal 212 to the second panel 2; and the length of the wiring from the first data-line-test input terminal 111 to the first panel 1 is the same as that of the wiring from the third data-line-test input terminal 211 to the second panel 2.

More specifically, for example, with respect to one exposure unit arranged on the substrate in a transverse direction, for the first data-line-test line 11 connected with the first panel 1, the length of the wiring from the first data-line-test input terminal 111 to the first panel 1 is the same as that of the wiring from the second data-line-test input terminal 112 to the first panel 1, and thus, the input resistance between the first data-line-test input terminal 111 and the first panel 1 is equal to that between the second data-line-test input terminal 112 and the first panel 1, and the signal decay degree is identical over the wirings during transmission. Therefore, when the test signals are inputted from the two test input terminals to detect electric defects, the identical detection ability can be achieved for the first data-line-test line 11 on the first panel 1. Likewise, when the test signals are loaded from the two test input terminals to detect electric defects, the identical detection ability can also be achieved for the second data-line-test line 12 on the second panel 2.

With respect to the first data-line-test line 11 connected with the first panel 1 and the second data-line-test line 21 connected with the second panel 2, the length of the wiring from the first data-line-test input terminal 111 to the first panel 1 is the same as that of the wiring from the third data-line-test input terminal 211 positioned at the same side as the first data-line-test input terminal 111 to the second panel 2, and thus, the input resistance of the first data-line-test line 11 connected with the first panel 1 is equal to that of the second data-line-test line 21 connected with the second panel 2, and the signal decay degree is identical over the wirings during transmission. Therefore, the identical detecting ability can be obtained for the detection at any position of the substrate by using the first data-line-test line 11 and the second data-line-test line 21.

In the present embodiment, by making the length of the wiring from the first data-line-test input terminal of the first data-line-test line to the first panel equal to that of the wiring from the second data-line-test input terminal of the first data-line-test line to the first panel and by making the length of the wiring from the third data-line-test input terminal of the second data-line-test line to the second panel equal to that of the wiring from the fourth data-line-test input terminal of the second data-line-test line to the second panel, the input resistances of two test input terminals of the first data-line-test line are identical and the input resistances of two test input terminals of the second data-line-test line are identical also, and thus, when the test signals are loaded from the two test input terminals to detect electric defects, the identical detecting ability can be achieved; by making the length of the wiring from the first data-line-test input terminal to the first panel equal to that of the wiring from the third data-line-test input terminal to the second panel, the input resistance between each of the test input terminals and the first panel is equal to that between each of the test input terminals and the second panel also, so that the voltage drop when the test signals are transmitted through the first data-line-test line and the second data-line-test line is the same, and the test signals actually loaded to each of the panels are the same and the abilities of the test circuit to detect electric defects of the data lines of each of the panels are the same. Therefore, the same effect to detect the electric defect of the data lines can be achieved at any position on the substrate.

Based on the substrate test circuit according to the fourth embodiment, in order to achieve the same ability to detect the electric defect of the gate lines at any position of the substrate, the substrate test circuit of the present embodiment further comprises a first gate-line-test line connected with the first panel and a second gate-line-test line connected with the second panel. The first gate-line-test line comprises a first gate-line-test input terminal and a second gate-line-test input terminal, which are disposed on the both sides of the exposure unit, the second gate-line-test line comprises a third gate-line-test input terminal and a fourth gate-line-test input terminal, which are disposed on the both sides of the exposure unit, and the first gate-line-test input terminal and the third gate-line-test input terminal are disposed on the same side of the exposure unit. The length of the wiring from the first gate-line-test input terminal to the first panel is the same as that of the wiring from the second gate-line-test input terminal to the first panel, the length of the wiring from the third gate-line-test input terminal to the second panel is the same as that of the wiring from the fourth gate-line-test input terminal to the second panel, and the length of the wiring from the first gate-line-test input terminal to the first panel is the same as that of the wiring from the third gate-line-test input terminal to the second panel.

In order to achieve the same ability to detect the common electrode lines having the electric defect at any position of the substrate, the substrate test circuit of the present embodiment may further comprise a first common-electrode-line-test line connected with the first panel and a second common-electrode-line-test line connected with the second panel. The first common-electrode-line-test line comprises a first common-electrode-line-test input terminal and a second common-electrode-line-test input terminal, which are disposed on the both sides of the exposure unit, the second common-electrode-line-test line comprises a third common-electrode-line-test input terminal and a fourth common-electrode-line-test input terminal, which are disposed on the both sides of the exposure unit, and the first common-electrode-line-test input terminal and the third common-electrode-line-test input terminal are disposed on the same side of the exposure unit. The length of the wiring from the first common-electrode-line-test input terminal to the first panel is the same as that of the wiring from the second common-electrode-line-test input terminal to the first panel, the length of the wiring from the third common-electrode-line-test input terminal to the second panel is the same as that of the wiring from the fourth common-electrode-line-test input terminal to the second panel, and the length of the wiring from the first common-electrode-line-test input terminal to the first panel is the same as that of the wiring from the third common-electrode-line-test input terminal to the second panel. The obtained effect is the same as the effect for detecting the data line having electric defects, and thus, the detailed description thereof is omitted here.

Figure 6:
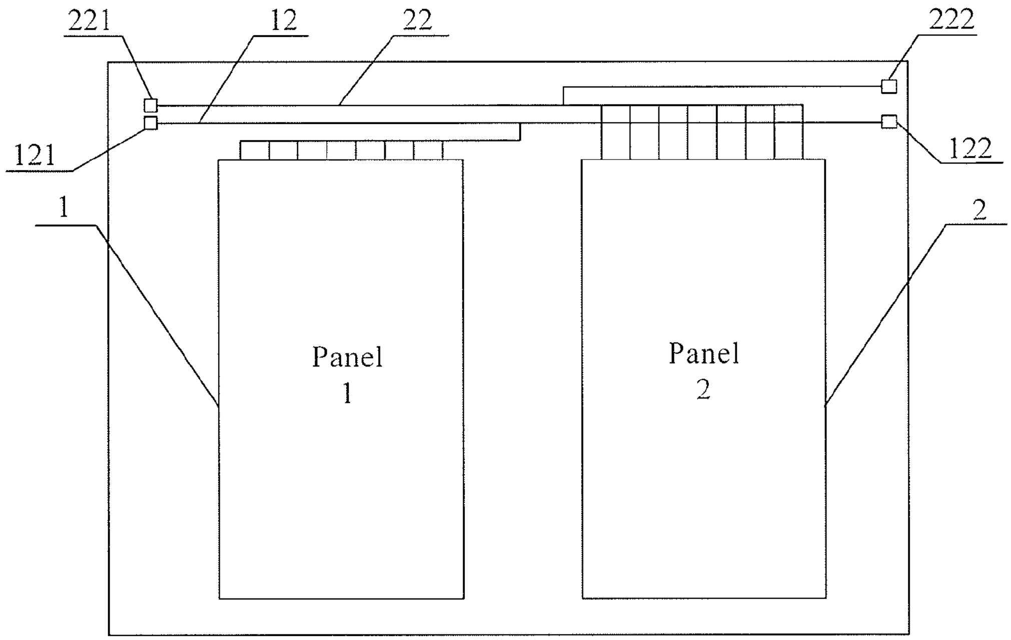
FIG. 6 is a schematic view illustrating a structure of a substrate test circuit according to a fifth embodiment of the present invention.

FIG. 6 is a schematic view illustrating a structure of a substrate test circuit according to a fifth embodiment of the present invention. As shown in FIG. 6, the substrate test circuit of the present embodiment comprises a first gate-line-test line 12 connected with a first panel 1 in a single exposure unit and a second gate-line-test line 22 connected with a second panel 2 in the exposure unit. The first gate-line-test line 12 comprises a first gate-line-test input terminal 121 and a second gate-line-test input terminal 122, which are disposed on the both sides of the exposure unit. The second gate-line-test line 22 comprises a third gate-line-test input terminal 221 and a fourth gate-line-test input terminal 222, which are disposed on the both sides of the exposure unit. The first gate-line-test input terminal 121 and the third gate-line-test input terminal 221 are disposed on the same side of the exposure unit. The length of the wiring from the first gate-line-test input terminal 121 to the first panel 1 is the same as that of the wiring from the second gate-line-test input terminal 122 to the first panel 1, the length of the wiring from the third gate-line-test input terminal 221 to the second panel 2 is the same as that of the wiring from the fourth gate-line-test input terminal 222 to the second panel 2, and the length of the wiring from the first gate-line-test input terminal 121 to the first panel 1 is the same as that of the wiring from the third gate-line-test input terminal 221 to the second panel 2.

More specifically, with respect to one exposure unit arranged on the substrate in a transverse direction, for the first gate-line-test line 12 connected with the first panel 1, the length of the wiring from the first gate-line-test input terminal 121 to the first panel 1 is the same as that of the wiring from the second gate-line-test input terminal 122 to the first panel 1, and thus, the input resistance between the first gate-line-test input terminal 121 and the first panel 1 is equal to that between the second gate-line-test input terminal 122 and the first panel 1, and the signal decay degree is identical over the wirings during transmission. Therefore, when the test signals are inputted from the two test input terminals to detect electric defects, the identical detecting ability can be achieved for the first gate-line-test line 12 on the first panel 1. Likewise, when the test signals are loaded from the two test input terminals to detect electric defects, the identical detecting ability can be achieved for the second gate-line-test line 22 on the second panel 2.

With respect to the first gate-line-test line 12 connected with the first panel 1 and the second gate-line-test line 22 connected with the second panel 2, the length of the wiring from the first data-line-test input terminal 121 to the first panel 1 is the same as that of the wiring from the third data-line-test input terminal 221 positioned at the same side as the first data-line-test input terminal 121 to the second panel, and thus, the input resistance of the first gate-line-test line 12 connected with the first panel 1 is equal to that of the second gate-line-test line 22 connected with the second panel 2, and the degree of signal decay is identical over the wirings during transmission. Therefore, the identical detecting ability can be obtained for the detection at any position of the substrate by using the first gate-line-test line 12 and the second gate-line-test line 22.

In the present embodiment, by making the length of the wiring from the first gate-line-test input terminal of the first gate-line-test line to the first panel equal to that of the wiring from the second gate-line-test input terminal of the first gate-line-test line to the first panel and by making the length of the wiring from the third gate-line-test input terminal of the second gate-line-test line to the second panel equal to that of the wiring from the fourth gate-line-test input terminal of the second gate-line-test line to the second panel, the input resistances of two test input terminals of the first gate-line-test line are identical and the input resistances of two test input terminals of the second gate-line-test line are identical, and thus, when the test signals are loaded from the two test input terminals to detect electric defects, the identical detecting ability can be achieved. By making the length of the wiring from the first gate-line-test input terminal to the first panel equal to that of the wiring from the third gate-line-test input terminal to the second panel, the input resistance between each of the test input terminals and the first panel is equal to that between each of the test input terminals and the second panel, so that the voltage drops during the test signal being transmitted through the first gate-line-test line and the second gate-line-test line are the same, and the test signals actually loaded to each of the panels are the same and the abilities of the test circuit to detect the electric defect of the gate lines of each of the panels are identical. Therefore, the same effect to detect electric defects of the gate lines can be achieved at any position on the substrate.

In order to achieve the same ability to detect the electric defects of the data lines at any position of the substrate, based on the substrate test circuit according to the fifth embodiment, the substrate test circuit of the present embodiment may further comprise a first data-line-test line connected with the first panel and a second data-line-test line connected with the second panel. The first data-line-test line comprises a first data-line-test input terminal and a second data-line-test input terminal, which are disposed on the both sides of the exposure unit, the second data-line-test line comprises a third data-line-test input terminal and a fourth data-line-test input terminal, which are disposed on the both sides of the exposure unit, and the first data-line-test input terminal and the third data-line-test input terminal are disposed on the same side of the exposure unit. The length of the wiring from the first data-line-test input terminal to the first panel is the same as that of the wiring from the second data-line-test input terminal to the first panel, the length of the wiring from the third data-line-test input terminal to the second panel is the same as that of the wiring from the fourth data-line-test input terminal to the second panel, and the length of the wiring from the first data-line-test input terminal to the first panel is the same as that of the wiring from the third data-line-test input terminal to the second panel. The obtained effect is the same as the effect for detecting the gate line having the electric defect as described above, and thus, the detailed description thereof will be omitted.

Figure 7:
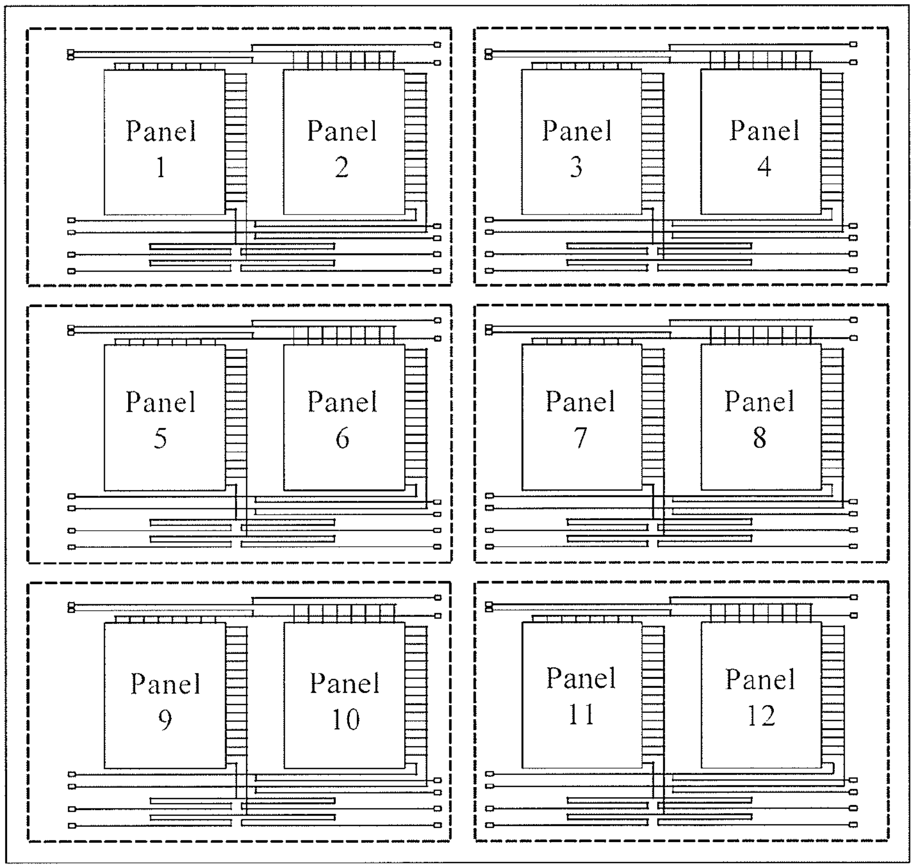
FIG. 7 is a schematic view illustrating a structure of a substrate according to an embodiment of the present invention.

FIG. 7 is a schematic view illustrating a structure of a substrate according to an embodiment of the present invention. As shown in FIG. 7, the substrate of the present embodiment comprises two exposure units arranged in a transverse direction and three exposure units arranged in a vertical direction, that is, 3×2 exposure units (i.e., 12 panels), are arranged on the substrate. The panels are labeled as shown in FIG. 7. Because the same mask is used for manufacturing each of the exposure units, the present embodiment can use the substrate test circuit shown in FIG. 4 according to the second embodiment of the invention.

The data-line-test line, the gate-line-test line and the common-electrode-line-test line of a exposure unit described below correspond to the first data-line-test line, the first gate-line-test line and the first common-electrode-line-test line connected with the first panel and the second data-line-test line, the second gate-line-test line and the second common-electrode-line-test line connected with the second panel in the substrate test circuit according to the second embodiment of the present invention, respectively.

Taking two exposure units in a first row shown in FIG. 7, that is, four panels, as an example, the length and the width of each of the panels are identified as "a" and "b," respectively, and the resistance per unit length of each of the test lines is: R1 for a data-line-test line, R2 for the gate-line-test line and R3 for the common-electrode-line-test line, and thus, the input resistance of the test lines connected with each of the panels in the first row is shown in Table 1.

TABLE 1

| Test Line | First panel | Second panel | Third panel | Fourth panel |
|---|---|---|---|---|
| Data-line-test line | 2bR1 | 2bR1 | 2bR1 | 2bR1 |
| Gate-line-test line | bR2 | bR2 | bR2 | bR2 |
| Common-electrode-line-test line | 2bR3 | 2bR3 | 2bR3 | 2bR3 |

As shown in Table 1, the input resistances for the same kind of the test lines of each of the panels are identical, and thus, the detecting ability of the test circuit of the present embodiment is identical for each of the panels.

The test circuit of the present embodiment can be obtained by the following steps: firstly, the position of the branch point of two test input terminals of the same test line, for example, the position of the branch point between the first data-line-test input terminal 111 and the second data-line-test input terminal 112 of the first data-line-test line 11, may be determined such that the distances from the branch point to the two test input terminals are identical; after setting the position of the branch points, by comparing the length of the wiring of the same kind of test lines in two panels of one exposure unit, the zigzag route is added to the shorter test line at the proper position, and as shown in FIG. 7, the data-line-test line of the first panel 1 may disposed such that the length of the wiring from the test input terminal of the data-line-test line for the first panel to the first panel is equal to the length of the wiring from the test input terminal of the data-line-test line for the second panel to the second panel, that is, the input resistances of the two data-line-test line are identical and the signal decay degree is the same.

It should be noted that the above mentioned equivalency or the like, for example, the equivalency between the length of the wiring from the test input terminal of the data-line-test line for the first panel to the first panel and the length of the wiring from the test input terminal of the data-line-test line for the second panel to the second panel, i.e., the equivalence between the input resistances of the two data-line-test lines and also that between the signal decay degrees, is not intended to be absolutely equal, and the slightly difference may exist, thus the equivalency comprises the case of being approximately equal. It further should be noted that only three exposure units are disposed in a vertical direction, but more exposure units may be disposed in a vertical direction as desired in the present embodiment.

In the substrate of the present embodiment, for two panels of one exposure unit, the input resistances between the two test input terminals of the same test line to one panel are equal; the input resistances of the same kind of test lines of the two panels are also equal, such that when two exposure units are arranged in a transverse direction and a plurality of exposure units are arranged in a vertical direction, the same ability to detect the electric defect of the panel can be obtained at any position of the substrate, and thus, it is convenient to detect the electric defect of the panel.

The embodiment of the invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A substrate comprising at least one exposure unit disposed at a transverse direction and a substrate test circuit, wherein the substrate test circuit comprises:

a first data-line-test line, a first gate-line-test line and a first common-electrode-line-test line, which are connected with a first panel within a single exposure unit, wherein the first data-line-test line comprises a first data-line-test input terminal and a second data-line-test input terminal, which are disposed on both sides of the exposure unit, the first gate-line-test line comprises a first gate-line-test input terminal and a second gate-line-test input terminal, which are disposed on both sides of the exposure unit, the first common-electrode-line-test line comprises a first common-electrode-line-test input terminal and a second common-electrode-line-test input terminal, which are disposed on both sides of the exposure unit, the first data-line-test input terminal, the first gate-line-test input terminal and the first common-electrode-line-test input terminal are disposed on the same side of the exposure unit, a length of a wiring from the first data-line-test input terminal to the first panel is the same as a length of a wiring from the second data-line-test input terminal to the first panel;

a length of a wiring from the first gate-line-test input terminal to the first panel is the same as a length of a wiring from the second gate-line-test input terminal to the first panel; and a length of a wiring from the first common-electrode-line-test input terminal to the first panel is the same as a length of a wiring from the second common-electrode-line-test input terminal to the first panel, wherein at least one of the wiring from the first data-line-test input terminal to the first panel and the wiring from the second data-line-test input terminal to the first panel, at least one of the wiring from the first gate-line-test input terminal to the first panel and the wiring from the second gate-line-test input terminal to the first panel and at least one of the wiring from the first common-electrode-line-test input terminal to the first panel and the wiring from the second common-electrode-line-test input terminal to the first panel comprise a zigzag route.

2. The substrate of claim 1, further comprising:

a second data-line-test line, a second gate-line-test line and a second common-electrode-line-test line connected with a second panel within the exposure unit, wherein the second data-line-test line comprises a third data-line-test input terminal and a fourth data-line-test input terminal, which are disposed on both sides of the exposure unit, the second gate-line-test line comprises a third gate-line-test input terminal and a fourth gate-line-test input terminal, which are disposed on both sides of the exposure unit, the second common-electrode-line-test line comprises a third common-electrode-line-test input terminal and a fourth common-electrode-line-test input terminal, which are disposed on both sides of the exposure unit, and the third data-line-test input terminal, the third gate-line-test input terminal and the third common-electrode-line-test input terminal are disposed on the same side of the exposure unit, a length of a wiring from the third data-line-test input terminal to the second panel is the same as a length of a wiring from the fourth data-line-test input terminal to the second panel;

a length of a wiring from the third gate-line-test input terminal to the second panel is the same as a length of a wiring from the fourth gate-line-test input terminal to the second panel; and a length of a wiring from the third common-electrode-line-test input terminal to the second panel is the same as a length of a wiring from the fourth common-electrode-line-test input terminal to the second panel.

3. The substrate of claim 2, wherein the length of the wiring from the first data-line-test input terminal to the first panel is the same as the length of the wiring from the third data-line-test input terminal to the second panel;

the length of the wiring from the first gate-line-test input terminal to the first panel is the same as the length of the wiring from the third gate-line-test input terminal to the second panel; and the length of the wiring from the first common-electrode-line-test input terminal to the first panel is the same as the length of the wiring from the third common-electrode-line-test input terminal to the second panel.

4. The substrate of claim 1, comprising two exposure units in the transverse direction and a plurality of exposure units in a vertical direction, wherein each exposure unit comprising the substrate test circuit.

5. A substrate comprising at least one exposure unit disposed at a transverse direction and a substrate test circuit, wherein the substrate test circuit comprises:

a first data-line-test line connected with a first panel within a single exposure unit, and a second data-line-test line connected with a second panel within the exposure unit, wherein the first data-line-test line comprises a first data-line-test input terminal and a second data-line-test input terminal, which are disposed on both sides of the exposure unit, the second data-line-test line comprises a third data-line-test input terminal and a fourth data-line-test input terminal, which are disposed on both sides of the exposure unit, the first data-line-test input terminal and the third data-line-test input terminal are disposed on the same side of the exposure unit, and a length of a wiring from the first data-line-test input terminal to the first panel is the same as a length of a wiring from the second data-line-test input terminal to the first panel;

a length of a wiring from the third data-line-test input terminal to the second panel is the same as a length of a wiring from the fourth data-line-test input terminal to the second panel; and the length of the wiring from the first data-line-test input terminal to the first panel is the same as the length of the wiring from the third data-line-test input terminal to the second panel, wherein at least one of the wiring from the first data-line-test input terminal to the first panel, the wiring from the second data-line-test input terminal to the first panel, the wiring from the third data-line-test input terminal to the second panel and the wiring from the fourth data-line-test input terminal to the second panel comprises a zigzag route.

6. The substrate of claim 5, further comprising:

a first gate-line-test line connected with the first panel, and a second gate-line-test line connected with the second panel, wherein the first gate-line-test line comprises a first gate-line-test input terminal and a second gate-line-test input terminal, which are disposed on both sides of the exposure unit, the second gate-line-test line comprises a third gate-line-test input terminal and a fourth gate-line-test input terminal, which are disposed on both sides of the exposure unit, the first gate-line-test input terminal and the third gate-line-test input terminal are disposed on the same side of the exposure unit, a length of a wiring from the first gate-line-test input terminal to the first panel is the same as a length of a wiring from the second gate-line-test input terminal to the first panel;

a length of a wiring from the third gate-line-test input terminal to the second panel is the same as a length of a wiring from the fourth gate-line-test input terminal to the second panel; and the length of the wiring from the first gate-line-test input terminal to the first panel is the same as the length of the wiring from the third gate-line-test input terminal to the second panel.

7. The substrate test circuit of claim 6, further comprising:

a first common-electrode-line-test line connected with the first panel, and a second common-electrode-line-test line connected with the second panel, wherein the first common-electrode-line-test line comprises a first common-electrode-line-test input terminal and a second common-electrode-line-test input terminal, which are disposed on both sides of the exposure unit, the second common-electrode-line-test line comprises a third common-electrode-line-test input terminal and a fourth common-electrode-line-test input terminal, which are disposed on both sides of the exposure unit, the first common-electrode-line-test input terminal and the third common-electrode-line-test input terminal are disposed on the same side of the exposure unit, a length of a wiring from the first common-electrode-line-test input terminal to the first panel is the same as a length of a wiring from the second common-electrode-line-test input terminal to the first panel;

a length of a wiring from the third common-electrode-line-test input terminal to the second panel is the same as a length of a wiring from the fourth common-electrode-line-test input terminal to the second panel; and the length of the wiring from the first common-electrode-line-test input terminal to the first panel is the same as the length of the wiring from the third common-electrode-line-test input terminal to the second panel.

8. The substrate test circuit of claim 5, further comprising:

a first common-electrode-line-test line connected with the first panel, and a second common-electrode-line-test line connected with the second panel, wherein the first common-electrode-line-test line comprises a first common-electrode-line-test input terminal and a second common-electrode-line-test input terminal, which are disposed on both sides of the exposure unit, the second common-electrode-line-test line comprises a third common-electrode-line-test input terminal and a fourth common-electrode-line-test input terminal, which are disposed on both sides of the exposure unit, the first common-electrode-line-test input terminal and the third common-electrode-line-test input terminal are disposed on the same side of the exposure unit, a length of a wiring from the first common-electrode-line-test input terminal to the first panel is the same as a length of a wiring from the second common-electrode-line-test input terminal to the first panel;

a length of a wiring from the third common-electrode-line-test input terminal to the second panel is the same as a length of a wiring from the fourth common-electrode-line-test input terminal to the second panel; and the length of the wiring from the first common-electrode-line-test input terminal to the first panel is the same as the length of the wiring from the third common-electrode-line-test input terminal to the second panel.

9. The substrate of claim 5, comprising two exposure units in the transverse direction and a plurality of exposure units in a vertical direction, wherein each exposure unit comprising the substrate test circuit.

10. A substrate comprising at least one exposure unit disposed at a transverse direction and a substrate test circuit, wherein the substrate test circuit comprises:

a first gate-line-test line connected with a first panel within a single exposure unit, and a second gate-line-test line connected with a second panel in the exposure unit, wherein the first gate-line-test line comprises a first gate-line-test input terminal and a second gate-line-test input terminal, which are disposed on both sides of the exposure unit, the second gate-line-test line comprises a third gate-line-test input terminal and a fourth gate-line-test input terminal , which are disposed on both sides of the exposure unit, the first gate-line-test input terminal and the third gate-line-test input terminal are disposed on the same side of the exposure unit, a length of a wiring from the first gate-line-test input terminal to the first panel is the same as a length of a wiring from the second gate-line-test input terminal to the first panel;

a length of a wiring from the third gate-line-test input terminal to the second panel is the same as a length of a wiring from the fourth gate-line-test input terminal to the second panel; and the length of the wiring from the first gate-line-test input terminal to the first panel is the same as the length of the wiring from the third gate-line-test input terminal to the second panel, wherein at least one of the wiring from the first gate-line-test input terminal to the first panel, the wiring from the second gate-line-test input terminal to the first panel, the wiring from the third gate-line-test input terminal to the second panel and the wiring from the fourth gate-line-test input terminal to the second panel comprises a zig-zag route.

11. The substrate of claim 10, further comprising:

a first data-line-test line connected with the first panel, and a second data-line-test line connected with the second panel, wherein the first data-line-test line comprises a first data-line-test input terminal and a second data-line-test input terminal disposed on both sides of the exposure unit, the second data-line-test line comprises a third data-line-test input terminal and a fourth data-line-test input terminal disposed on both sides of the exposure unit, the first data-line-test input terminal and the third data-line-test input terminal are disposed on the same side of the exposure unit, a length of a wiring from the first data-line-test input terminal to the first panel is the same as a length of a wiring from the second data-line-test input terminal to the first panel;

a length of a wiring from the third data-line-test input terminal to the second panel is the same as a length of a wiring from the fourth data-line-test input terminal to the second panel; and the length of the wiring from the first data-line-test input terminal to the first panel is the same as the length of the wiring from the third data-line-test input terminal to the second panel.

12. The substrate of claim 10, comprising two exposure units in the transverse direction and a plurality of exposure units in a vertical direction, wherein each exposure unit comprising the substrate test circuit.

* * * * *